US012701930B2

(12) United States Patent
Tarancón Rubio et al.

(10) Patent No.: US 12,701,930 B2
(45) Date of Patent: Aug. 4, 2026

(54) ELECTRONIC TRANSISTORS

(71) Applicants: FUNDACIÓ INSTITUT DE RECERCA EN ENERGIA DE CATALUNYA, Sant Adrià del Besòs (ES); INSTITUCIÓ CATALANA DE RECERCA I ESTUDIS AVANÇATS, Barcelona (ES)

(72) Inventors: Albert Tarancón Rubio, Barcelona (ES); Francesco Chiabrera, Arenzano (IT); Iñigo Garbayo Senosiain, Pamplona (ES); Nerea Alayo Bueno, Bilbao (ES); Alex Morata García, St. Adrià de Besos (ES); Yunqing Tang, Sant Adrià del Besòs (ES)

(73) Assignees: FUNDACIO INSTITUT DE RECERCA EN ENERGIA DE CATALUNYA, Sant Adrià del Besòs (ES); INSTITUCIÓ CATALANA DE RECERCA I ESTUDIS AVANÇATS, Barcelona (ES)

( * ) Notice: Subject to any disclaimer, the term of this patent is extended or adjusted under 35 U.S.C. 154(b) by 323 days.

(21) Appl. No.: 18/571,676

(22) PCT Filed: Jun. 17, 2022

(86) PCT No.: PCT/EP2022/066614
§ 371 (c)(1),
(2) Date: Dec. 18, 2023

(87) PCT Pub. No.: WO2022/263659
PCT Pub. Date: Dec. 22, 2022

(65) Prior Publication Data
US 2024/0292763 A1     Aug. 29, 2024

(30) Foreign Application Priority Data
Jun. 18, 2021   (EP) ..................................... 21382543

(51) Int. Cl.
*H10N 70/20* (2023.01)
*G06N 3/063* (2023.01)
*H10N 70/00* (2023.01)

(52) U.S. Cl.
CPC ........... *H10N 70/253* (2023.02); *G06N 3/063* (2013.01); *H10N 70/011* (2023.02); *H10N 70/245* (2023.02); *H10N 70/8836* (2023.02)

(58) Field of Classification Search
CPC .... H10N 70/00; H10N 70/011; H10N 70/245; H10N 70/253; H10N 70/883; H10N 70/8836; H10N 70/021
See application file for complete search history.

(56) References Cited

U.S. PATENT DOCUMENTS 7,723,714 B2 * 5/2010 Karg ...................... H10N 70/24
                                                          257/3
10,497,866 B1  12/2019 Fuller et al.
(Continued)

OTHER PUBLICATIONS

PCT/EP2022/066614 International Search Report, Search Strategy and Written Opinion (15 pages total); European Patent Office, Rijswijk NL, mailing Sep. 27, 2022.
(Continued)

*Primary Examiner* — Telly D Green
(74) *Attorney, Agent, or Firm* — Peter B Scull

(57) ABSTRACT
The present disclosure relates to an electronic transistor including a body including at least an electrolyte structure, a channel provided in contact with the electrolyte structure, a gate provided in contact with the electrolyte structure; at least three contact elements configured to be connected to an external circuit, at least one of the contact elements, referenced as a Gate contact element, being separated from the electrolyte structure by the gate, and the other contact elements, referenced as a Source contact element and a Drain contact element, being interconnected and being sepa-
(Continued)

100 rated from the electrolyte structure by the channel. The electrolyte structure includes an oxygen ion conducting electrolyte structure, the oxygen ion conducting electrolyte structure including a BiMEVOX structure, Bi is Bismuth, ME is a Metal, V is Vanadium and OX is an OXide.

20 Claims, 3 Drawing Sheets

(56)                    References Cited

U.S. PATENT DOCUMENTS

| | | |
|---|---|---|
| 2008/0149911 A1 | 6/2008 | Karg |
| 2009/0122465 A1 | 5/2009 | Lin |
| 2013/0234098 A1* | 9/2013 | Rothschild .............. G11C 11/36 |
| | | 257/4 |
| 2018/0358552 A1 | 12/2018 | Brew |

OTHER PUBLICATIONS

Kida T et al.; "Planar-type BiCuVO"x solid electrolyte sensor for the detection of volatile organic compounds, Sensors and Actuators B: Chemical, Elsevier BV, NL, vol. 137. No. 1, Mar. 28, 2009 {Mar. 28, 2009), pp. 147-153, XP025962260, ISSN: 0925-4005, DOI: 10.1016/J.SNB.2008.12.014 [retrieved on Dec. 14, 2008].

* cited by examiner

ELECTRONIC TRANSISTORS

The present disclosure relates to electronic transistors and to methods of forming electronic transistors.

BACKGROUND

Metal Oxide Semiconductor Field Effect Transistor (MOSFET) is vastly used in electronics and computing industry. Complementary Metal Oxide Semiconductor (CMOS) is a type of MOSFET that uses complementary and symmetrical pairs of p-type and n-type MOSFETs for logic functions.

CMOS is used for construing integrated circuits including processors, microprocessors, microcontrollers, memory chips (e.g., CMOS BIOS), and other digital logic circuits. These integrated circuits based on CMOS technology are vastly used in computing electronics. As downscaling the size (in nm) of the CMOS transistors, computing performance is improved.

In addition, current computing performance is based on Von Neumann architecture and uses discrete information processing approaches and/or hierarchical storage. It is ideal for solving complex computational problems but limits computational performance efficiency due to Von Neumann bottleneck.

To that end, neuromorphic computing has been developed to realize human brain functionality as an alternative to the Von Neumann approach. This approach offers massively parallel and distributed computation that combines processing and memory with a very low power consumption.

As reaching CMOS scaling limits, other computing devices and technologies need to be developed to overcome CMOS low voltage, low power, and high-performance limitations.

As a result, Electrolyte-gated transistors (EGTs) have been developed. Electrolyte gating offers significant advantages for the realization of neuromorphic devices/architectures, including ultralow-voltage operation and the ability to form parallel-interconnected networks.

In addition, three-terminal devices have been developed that use an electrolyte gated transistor to control the resistance and/or conductance of a channel via injection or extraction of ions (e.g., $H^+$, $Ag^+$, $Li^+$, $Cu^{2+}$, $O^{2-}$) that is triggered by a voltage applied at the gate electrode where the electrolyte (e.g., solid or liquid), contacting the gate with the channel, conducts ions. By modifying the resistance and/or the conductance of the channel that contacts a drain electrode with a source electrode, a switch may be obtained. However, the switching of these devices may be slow and/or lacking reversible multilevel switching.

Nevertheless, EGTs and/or three terminal devices that use EGTs are difficult to integrate with solid-state devices (e.g., CMOS-based devices). EGTs and/or three terminal devices are temperature sensitive and/or unstable under humidity. In the case of Li-ion conductors, reported materials present poor stability in ambient atmosphere and self-discharge issues hinder their real implementation in EGTs. In the case of EGTs based on oxygen conductors, the lack of room and/or low-temperature oxide-ionic conductors forces operation at non-viable elevated temperatures (e.g., above 200° C.).

In addition, these devices have poor/no compatibility with mainstream microelectronics fabrication processes (e.g., CMOS fabrication processes). CMOS fabrication processes permit scalability and well-known fabrication methods. EGTs that are compatible with CMOS fabrication processes are desirable.

SUMMARY

According to a first aspect, an electronic transistor is provided. The transistor may include a body. The body may include at least an electrolyte structure; a channel provided in contact with the electrolyte structure; a gate provided in contact with the electrolyte structure. The transistor may include at least three contact elements configured to be connected to an external circuit. At least one of the contact elements, referenced as a Gate contact element, may be separated from the electrolyte structure by the gate. The other contact elements, that may include and be referenced as including a Source contact element and a Drain contact element, may be interconnected by the channel and may be separated from the electrolyte structure also by the channel. The electrolyte structure may include an oxygen ion conducting electrolyte structure. The oxygen ion conducting electrolyte structure may include a BiMEVOX structure, where Bi is Bismuth, ME is a Metal, V is Vanadium and OX is an OXide.

The BiMEVOX structure used as an electrolyte structure may provide some advantages to the electronic transistor, such as stability (BiMEVOX structure, as an oxide structure, can be used to expand the redox potential window and thereby widen the gate voltage range due to the excellent stability under large dc bias application), no dependency from external conditions (e.g., humidity, etc.) because oxide ions migrate via a vacancy mechanism or an interstitial mechanism, both of which are a bulk conduction mechanism needing no surface absorption; enhancement of manufacturing compatibility (compatible with mainstream microelectronic technology) or its performance at low temperatures (e.g. operation temperature at room temperature). This way, the BiMEVOX structure may provide the benefits of oxides, while enabling room temperature operation.

This last feature opens the door to a full new range of applications in microelectronic sectors, such as neuromorphic computing and stochastic computing. In this electronic transistor, a gate bias is applied through the room temperature-electrolyte (BiMEVOX structure) to change the oxygen stoichiometry of the channel by pumping oxygen ions across. In such a way, the gate voltage "programmes" the conductance of the channel that, in the absence of gate bias, remains unaltered for very long times (~years) giving rise to a non-volatile multistate transistor. Moreover, the electronic transistor hereof is compatible with microfabrication technologies.

In summary, the main distinctive features of said electronic transistors compared to existing EGTs may include:
  being fully based on oxide-ion conductors operating at a temperature below 200° C. such as room temperature, which makes it temperature insensitive (at least up to 200° C.) and stable under humidity;
  compatibility with semiconductor industry;
  lower voltage and power needed, and higher performance compared with current CMOS technology.

In some examples, the BiMEVOX structure may be configured to work in a temperature between 0° C. and 200° C., for example, at room temperature.

In some examples, the metal ME may be selected from at least one of the following:
  Copper (BiCuVOX);
  Cobalt (BiCoVOX);

Nickel (BiNiVOX);

Magnesium (BiMgVOX).

For example, BiCuVOX may be proposed due to its performance at low temperatures (i.e. between 0° C. and 200° C.).

In examples, the stoichiometry of the BiMEVOX structure may be $Bi_4V_{2-x}ME_xO_{11-\delta}$, where $0<x<1$ and $0<\delta<1$, for example, $Bi_4V_{1.8}Cu_{0.2}O_{10.7}$.

In some examples, the thickness of the BiMEVOX structure may be between 1 nm and 1 mm.

According to some examples, the channel may include a Mixed Ionic and Electronic Conductor (MIEC) oxide configured to vary its oxygen content, which supposes a consequent variation in its electronic conductivity.

In some examples, the gate may include a Mixed Ionic and Electronic Conductor (MIEC) oxide configured to vary its oxygen content, which supposes a consequent variation in its electronic conductivity.

In both cases, the Mixed Ionic and Electronic Conductor (MIEC) oxide may be selected from at least one of the following:

a fluorite oxide;

a Perovskites oxide;

a Perovskite-derived structure.

In examples, the fluorite oxide may include Rare earth (Re) doped Ceria such as $Ce_{1-x}Re_xO_{2-\delta}$, Re being selected from at least one of the following: Sm, Gd, Y, Pr, La.

In some examples, the Perovskites oxide may include $La_{1-x}Sr_{1-x}TmO_{3-\delta}$, the Transition metal (Tm) being selected from at least one of the following: Ti, V, Cr, Mn, Fe, Co, Cu, Ni, and $0<x<1$, for example, the Perovskites oxide may include a MIEC $La_{0.5}Sr_{0.5}FeO_{3-\delta}$ (LSF), where $0<\delta<0.5$.

According to some examples, the Perovskite-derived structure may include a Ruddlesden-Popper phase $La_{1-x}Sr_xTmO_{4+\delta}$, Tm being a Transition metal selected from at least one of the following: Mn, Cu, Ni, and $0<x<1$.

In examples, the thickness of the channel is between 1 nm and 1 mm.

In examples, the thickness of the gate is between 1 nm and 1 mm.

In some examples, the material of each of the at least three contact elements may be selected from at least one of the following:

a metal material;

an electrically conductive polymer material;

an electrically conductive ceramic material.

The material of the contact elements may be of high electrical conductivity, for example, with conductivity greater than $10^3$ S/cm.

In examples, the metal material may be selected from at least one of the following: Gold (Au); Nickel (Ni); Copper (Cu); Platinum (Pt); Palladium (Pd); any combination thereof.

According to some examples, the thickness of any of the at least three contact elements may be between 1 nm and 1 mm.

In some examples, the transistor may further include a seed between the Gate contact element and the gate and/or between at least one of the Source and the Drain contact elements, and the channel. The seed may be included to improve the adherence between a contact element and the channel. The seed may be the same or similar size of the contact element, occupying only the surface of the contact element.

According to another aspect, a method of forming an electronic transistor is provided. The method may include:

depositing a channel;

forming a first contact element, referenced as a Source contact element, and a second contact element, referenced as a Drain contact element, onto the channel;

depositing an electrolyte structure, the electrolyte structure including a BiMEVOX structure, where Bi is Bismuth, ME is a Metal, V is Vanadium and OX is an OXide;

depositing a gate onto the electrolyte structure;

forming at least a third contact element, referenced as a Gate contact element, onto the gate.

It may be noted that the disclosed steps of the method may be executed in any suitable order to form an electronic transistor.

In some examples, depositing the channel and depositing the gate may include depositing the channel and the gate onto the same side of the deposited electrolyte structure, the channel and the gate being in contact with the electrolyte structure. This way, an in-plane configuration of an electronic transistor may be obtained.

In some examples, depositing the electrolyte structure may include depositing the electrolyte structure onto the side of the deposited channel that is opposed to the side of the deposited channel in which the first contact element and the second contact element are formed, the channel being in contact with the electrolyte layer. In addition, depositing the gate onto the electrolyte structure may include depositing the gate onto the side of the electrolyte structure that is opposed to the side in which the electrolyte structure is in contact with the channel, the gate being in contact with the electrolyte structure. In this case, an out-of-plane configuration of an electronic transistor may be obtained.

In some examples, the method may further include depositing a seed onto the channel before forming the first contact element and/or the second contact element, the seed being between the channel and the first contact element and/or the channel and the second contact element. One of the first and second contact elements or both of them may include the seed. The seed may improve the adherence between a contact element and the channel. The seed may be the same or similar size of the contact element, occupying only the surface of the contact element.

In examples, the method may further include depositing a seed onto the gate before forming the third contact element, the seed being between the gate and the third contact element. The seed may improve the adherence between the third contact element and the gate. The seed may be the same or similar size of the third contact element, occupying only the surface of the third contact element.

According to another aspect, a method of forming an electronic transistor is provided. The method may include:

depositing an electrolyte structure, the electrolyte structure including a BiMEVOX structure, where Bi is Bismuth, ME is a Metal, V is Vanadium and OX is an OXide;

depositing a channel onto the deposited electrolyte structure;

depositing a gate onto the electrolyte structure on the same side of the electrolyte structure in which the channel is deposited;

forming a first contact element, referenced as a Source contact element, and a second contact element, referenced as a Drain contact element, onto the channel;

forming at least a third contact element, referenced as a Gate contact element, onto the gate.

This way, an in-plane configuration of an electronic transistor is obtained.

According to yet another aspect, a method of forming an electronic transistor may be provided. The method may include:

depositing a channel;

forming a first contact element, referenced as a Source contact element, and a second contact element, referenced as a Drain contact element, onto the channel;

depositing an electrolyte structure on top of the channel, the electrolyte structure including a BiMEVOX structure, where Bi is Bismuth, ME is a Metal, V is Vanadium and OX is an OXide;

depositing a gate on top of the electrolyte structure;

forming at least a third contact element, referenced as a Gate contact element, onto the gate.

This way, an out-of-plane configuration of an electronic transistor is obtained.

The term "structure" may be understood as a spatial pattern along 3 different directions (i.e. x, y, z) of a three-dimensional space which may be any suitable spatial arrangement such as, for example, a layer, a wafer, a cube, a cone, a cylinder, a disk, an hexagonal prism, a triangular prism, a pentagonal prism, a tetrahedron, an octahedron, a sphere and any combinations thereof.

The term "external medium" may be used to refer to the surroundings of the electronic transistor, e.g., the external environment and the external environment conditions.

The external environment conditions may include gas partial pressures (e.g., oxygen partial pressure); humidity conditions; and temperature.

The term "oxygen" may be used to refer to any allotrope of oxygen, e.g., $O_1$, $O_2$, $O_3$. Thus, the term "oxygen ions" may be used to refer to any ion of any allotrope of oxygen, e.g., $O^-$, $O^{2-}$.

BRIEF DESCRIPTION OF THE DRAWINGS

Non-limiting examples of the present disclosure will be described in the following, with reference to the appended drawings, in which.

DETAILED DESCRIPTION OF EXAMPLES

In these figures the same reference signs have been used to designate matching elements.

Figure 1A:
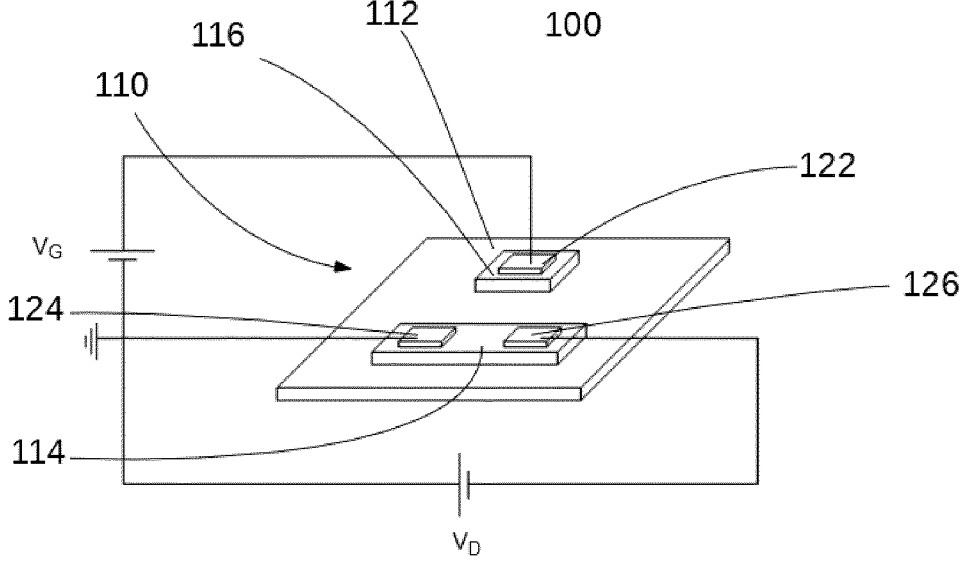
FIGS. 1a and 1b (hereafter referred to as FIG. 1a and FIG. 1b in correlation to/with the drawings) show respectively an example of an electronic transistor in an in-plane (FIG. 1a) and in an out-of-plane (FIG. 1b) configuration according to the present disclosure.
Figure 1B:
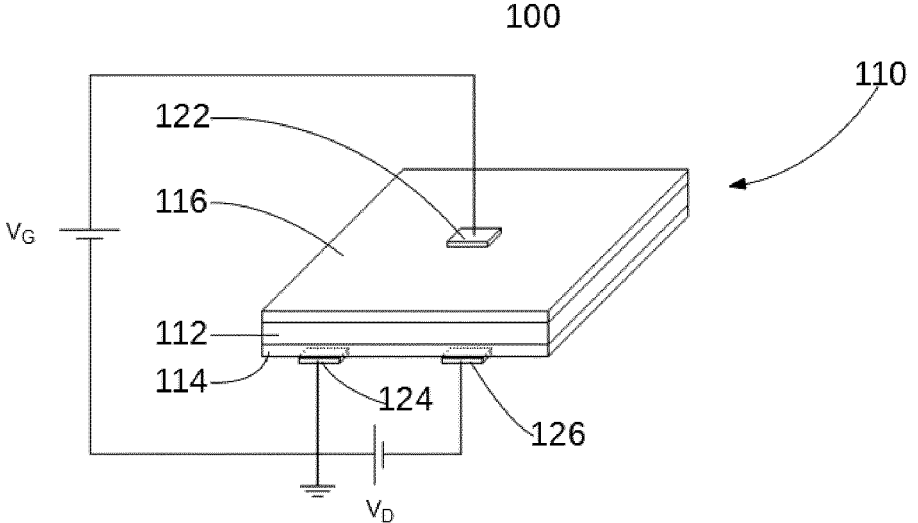

FIGS. 1a and 1b respectively show an example of an electronic transistor in an in-plane (FIG. 1a) and out-of-plane (FIG. 1b) configuration according to the present disclosure.

The electronic transistor 100 is a three-terminal device which may be an electrolyte-gated transistor (EGT). Electrolyte-gated transistors may offer significant advantages for the realization of neuromorphic devices/architectures, including ultralow-voltage operation and the ability to form parallel-interconnected networks.

An electronic transistor may be configured as a switch (i.e., switching operations including two different states that can be switched) or as an amplifier (i.e., when an input signal is amplified by the electronic transistor and an amplified output signal is obtained).

In FIG. 1a, the top side of an electrolyte structure 112 may contact a channel 114 at one end 115 of the electrolyte structure 112. Similarly, in FIG. 1b the bottom side of an electrolyte structure 112 may contact a channel 114.

In FIGS. 1a and 1b, the electrolyte structure 112 is an oxygen ion conducting electrolyte structure. The oxygen ion conducting electrolyte structure may be solid or liquid. In this example, the electrolyte structure 112 is a solid oxygen ion conducting electrolyte structure and may have a thickness between 1 nm and 1 mm, specifically the thickness of the ion conducting electrolyte structure may be between 20 nm and 5 μm.

In some examples, the electrolyte structure 112 may include a BiMeVOX structure, where Bi is Bismuth, Me is a metal, V is Vanadium and OX is an oxide. It is noted that the BiMeVOX structure is a solid ion conducting electrolyte structure.

The BiMeVOX structure has a layered aurivillius structure which may include alternating $[Bi_2O_2]^{2+}$ and transition metal-doped perovskite $[VO]^{2-}$ layers. The BiMeVOX structure may be used for ion (e.g., $O^{2-}$) transport from an ion donor structure (i.e., a structure which may donate ions) to an ion receiver structure (i.e., a structure which may accept ions). Increasing disordered oxygen vacancies in the perovskite $[VO]^{2-}$ layers may improve ion (e.g., $O^{2-}$) mobility. In addition, ion (e.g., $O^{2-}$) mobility may be maximized when the tetragonal γ-phase of the BiMeVOX structure is stabilized. Tetragonal γ-phase may be achieved at working temperatures above i.e., 550° C. Therefore, an ion conducting electrolyte structure with improved ion (e.g., $O^{2-}$) conductivity may be obtained.

In addition, the tetragonal γ-phase of the BiMeVOX structure may be stabilized at lower working temperatures (i.e., below 550° C.) by doping the vanadium with different metals (i.e., by cationic substitutions in vanadium positions). Therefore, the BiMeVOX structure may work in a temperature between 0° C. and 200° C., and more specifically at room temperature (i.e., 20° C.-25° C.).

The metal Me of the BiMeVOX structure may be selected from at least one of the following metals: copper (forming a BiCuVOX structure); cobalt (forming a BiCoVOX structure); nickel (forming a BiNiVOX structure); or magnesium (forming a BiMgVOX structure). Other metals may be used.

In addition, the stoichiometry of the BiMeVOX structure may be $Bi_4V_{2-x}M_xO_{11-\delta}$ where x may be between 0<x<1 and/or δ may be between 0<δ<1. Specifically, as an example, the stoichiometry of the BiMeVOX structure may be $Bi_4V_{1.8}Cu_{0.2}O_{10.7}$.

In some examples, the electrolyte structure 112 may be deposited via conventional synthesis and deposition methods such as physical vapor deposition (PVD), for example, cathodic arc deposition, electron-beam physical vapor deposition, close-space sublimation, pulsed laser deposition; thermal evaporation; electron-beam evaporation; sputtering, for example, diode sputtering, RF diode sputtering, triode sputtering, magnetron sputtering, reactive sputtering, or ion-beam sputtering; ion-assisted deposition; chemical vapor deposition (CVD); sol-gel coatings; or atomic layer deposition (ALD).

Particularly, the electrolyte structure 112 may be deposited via pulsed laser deposition. In this example (i.e., pulsed laser deposition), the electrolyte structure 112 may be deposited onto a substrate, for example, silicon, strontium titanate crystal $SrTiO_3$, polymers, metals, or ceramics. Alternatively, the substrate may include a strontium titanate crystal ($SrTiO_3$) layer with an underlying silicon layer. In addition, the substrate may be a substantially flat substrate and/or compatible with microelectronic fabrication. The thickness of the substrate may be between 50 nm and 1000 μm, specifically the thickness of the substrate may be between 100 nm and 300 nm.

In addition, a BiMeVOX structure such as $Bi_4V_{2-x}M_xO_{11}$ (where x may be between $0 < x < 1$ and/or δ may be between $0 < δ < 1$), specifically a BiMeVOX structure such as $Bi_4V_{1.8}Cu_{0.2}O_{10.7}$, may be grown epitaxially on (001) oriented substrates.

On the one hand, the BiMeVOX structure may present an anisotropy in oxygen ion conduction. The BiMeVOX structure may provide a first oxygen ion conduction along the in-plane principal axis [010] and [100].

On the other hand, the BiMeVOX structure along [001] axis may provide a second oxygen ion conduction which is orders of magnitude lower than the first oxygen ion conduction. As a result, the conductivity of oxygen ions along [001] axis is lower than the conductivity of oxygen ions along the in-plane principal axis [010] and [100].

Therefore, the deposition of (001) oriented BiMeVOX structures may allow to promote oxygen vacancy migration and/or oxygen ion conduction from the channel 114 to a gate 116; and/or from the gate 116 to the channel 114.

Furthermore, the substrates may be selected in function of their lattice parameters to match the lattice parameter of the BiMeVOX structure, which may allow an epitaxial growth of the BiMeVOX structure. Consequently, BiMeVOX structures may be grown epitaxially onto a substrate via pulsed laser deposition with a deposition pressure which may be between 0.0067 mbar and 0.267 mbar, specifically the deposition pressure may be 0.267 mbar.

Consequently, ion conducting electrolyte structures, which may be stable at temperatures between 0° C. and 200° C., and more specifically at room temperature (i.e. 20° C.-25° C.), may be obtained. In addition, the ion conducting electrolyte structures may be compatible with CMOS fabrication processes.

As aforementioned before, the electrolyte structure 112 may contact the channel 114. The channel 114 may include a Mixed Ionic and Electronic Conductor (MIEC) oxide layer. MIECs layers may be selected from at least one of the following: fluorite oxides, for example, Rare earth (Re) doped Ceria $Ce_{1-1}Re_xO_{2-δ}$ with rare earth (Re) such as samarium (Sm), gadolinium (Gd), yttrium (Y), praseodymium (Pr), lanthanum (La); perovskites oxides $La_{1-x}Sr_{1-x}TmO_{3-δ}$ with Tm transition metal such as titanium (Ti), vanadium (V), chromium (Cr), manganese (Mn), iron (Fe), cobalt (Co), copper (Cu), nickel (Ni) where x may be between $0 < x < 1$; or perovskite-derived structures such as Ruddlesden-Popper phase, for example, $La_{1-x}Sr_xTmO_{4+δ}$ with Tm transition metal such as manganese (Mn), copper (Cu), nickel (Ni) where x may be between $0 < x < 1$. Specifically, the channel 114 may be a perovskite oxide with the stoichiometry $La_{0.5}Sr_{0.5}FeO_{3-δ}$ (LSF), where δ may be between $0 < δ < 0.5$. Alternatively, MIECs layers may have an $ABO_3$ structure.

In addition, the channel 114 may have a thickness between 1 nm and 1 mm, specifically the thickness of the channel 114 may be between 20 nm and 5 μm.

In some examples, the channel 114 may be deposited via conventional synthesis and deposition methods such as physical vapor deposition (PVD) e.g. cathodic arc deposition, electron-beam physical vapor deposition, close-space sublimation, pulsed laser deposition; thermal evaporation; electron-beam evaporation; sputtering, for example, diode sputtering, RF diode sputtering, triode sputtering, magnetron sputtering, reactive sputtering, or ion-beam sputtering; ion-assisted deposition; chemical vapor deposition (CVD); sol-gel coatings; or atomic layer deposition (ALD).

As will be described with respect to FIG. 2, the oxygen content of the channel 114 may be varied, thereby decreasing or increasing the electronic conductivity of the channel such as the channel may be an insulator or a conductor depending on its oxygen content. Therefore, the channel 114 may be an ion donor structure (i.e., a structure which may donate ions) or an ion receiver structure (i.e., a structure which may accept ions).

Following the example, in FIG. 1a, the top side of the electrolyte structure 112 may contact the gate 116 at a second end 117 of the electrolyte structure 112. Similarly, in FIG. 1b, the top side of the electrolyte structure 112 may contact the gate 116. The gate 116 may include a Mixed Ionic and Electronic Conductor (MIEC) oxide layer. MIECs layers may be selected from at least one of the following: fluorite oxides, for example, Rare earth (Re) doped Ceria $Ce_{1-x}Re_xO_{2-δ}$ with rare earth (Re) such as samarium (Sm), gadolinium (Gd), yttrium (Y), praseodymium (Pr), lanthanum (La); perovskites oxides $La_{1-x}Sr_{1-x}TmO_{3-δ}$ with Tm transition metal such as titanium (Ti), vanadium (V), chromium (Cr), manganese (Mn), iron (Fe), cobalt (Co), copper (Cu), nickel (Ni) where x may be between $0 < x < 1$; or perovskite-derived structures such as Ruddlesden-Popper phase, for example, $La_{1-x}Sr_xTmO_{4+δ}$ with Tm transition metal such as manganese (Mn), copper (Cu), nickel (Ni) where x may be between $0 < x < 1$. Specifically, the gate 116 may be a perovskite oxide $La_{1-x}Sr_{1-x}TmO_{3-δ}$ with the stoichiometry $La_{0.5}Sr_{0.5}FeO_{3-δ}$ (LSF), where δ may be between $0 < δ < 0.5$. Alternatively, MIECs layers may have an $ABO_3$ structure.

In addition, the gate 116 may have a thickness between 1 nm and 1 mm, specifically the thickness of the gate 116 may be between 20 nm and 5 μm.

In some examples, the gate 116 may be deposited via conventional synthesis and deposition methods such as physical vapor deposition (PVD), for example, cathodic arc deposition, electron-beam physical vapor deposition, close-space sublimation, pulsed laser deposition; thermal evaporation; electron-beam evaporation; sputtering e.g. diode sputtering, RF diode sputtering, triode sputtering, magnetron sputtering, reactive sputtering, or ion-beam sputtering; ion-assisted deposition; chemical vapor deposition (CVD); sol-gel coatings; or atomic layer deposition (ALD).

As will be described with respect to FIG. 2, the oxygen content of the gate 116 may be varied, thereby decreasing or increasing the electronic conductivity of the channel such as the channel may be an insulator or a conductor depending on its oxygen content. Therefore, the gate 116 may be an ion donor structure (i.e., a structure which may donate ions) or an ion receiver structure (i.e., a structure which may accept ions).

In summary, the electronic transistor 100 illustrated in FIG. 1a and/or FIG. 1b is a three-terminal device which may be an electrolyte-gated transistor (EGT) and may include a body 110 including the electrolyte structure 112, the channel 114 and the gate 116. In addition, depending on the orientation and/or position of the channel 114 and the gate 116 with respect to the electrolyte structure 112, two different configurations of the electronic transistor 100 may be obtained.

Therefore, FIG. 1a may represent an in-plane configuration of the electronic transistor 100. In this example (i.e., FIG. 1a), the transport of ions (e.g., $O^{2-}$) may be pumped or transported across the electrolyte structure 112 where the channel 114 and the gate 116 may be at the same side (e.g., both on the top, or both on the bottom) of the electrolyte structure 112. Alternatively, FIG. 1b may represent an out-of-plane configuration of the electronic transistor 100. In this example (i.e., FIG. 1b), the transport of ions (e.g., $O^{2-}$) may be pumped or transported across the electrolyte structure 112 where the channel 114 and the gate 116 may be at opposite sides (e.g., on the top and on the bottom) of the electrolyte structure 112.

Again in FIG. 1a and FIG. 1b, the electronic transistor 100 may further include three contact elements. A Gate contact element 122 may be on the top of the electrolyte structure 112. Therefore, the gate contact element 122 may be separated from the electrolyte structure 112 by the gate 116. Similarly, a Source contact element 124 and a Drain contact element 126 may be on the opposite ends of the channel 114. Therefore, the source contact element 124 and the drain contact element 126 may be separated from the electrolyte structure 112 by the channel 114.

In some examples, a seed may be provided between the gate 116 and the gate contact element 122; and/or between the channel 114 and the source contact element 124; and/or between the channel 114 and the drain contact element 126. The seed may improve the adhesion of the contact elements (i.e., the gate contact element 122, the source contact element 124 and the drain contact element 126).

It is noted that adhesion may refer to the molecular attraction that holds the surfaces of two dissimilar substances together.

The seed may be of a material suitable to improve the adhesion of the contact elements such as metals, for example, copper (Cu), gold (Au), palladium (Pd), or any combination thereof.

The contact elements (i.e., the gate contact element 122, the source contact element 124 and the drain contact element 126) may be of a material suitable for conducting electric charges (e.g., a material with an electrical conductivity above $10^3$ S/cm) such as metals, for example, platinum (Pt), gold (Au), nickel (Ni), copper (Cu), palladium (Pd), or any combination thereof; electrically conductive polymers; or electrically conductive ceramics.

In addition, the contact elements may have a thickness between 1 nm and 1 mm. More specifically, the thickness of the contact elements may be between 20 nm and 5 μm. The same thickness for all contact elements is not required.

The contact elements and/or the seed may be deposited via conventional synthesis and deposition methods such as physical vapor deposition PVD (e.g. cathodic arc deposition, electron-beam physical vapor deposition, close-space sublimation, pulsed laser deposition); thermal evaporation; electron-beam evaporation; sputtering (e.g. diode sputtering, RF diode sputtering, triode sputtering, magnetron sputtering, reactive sputtering, or ion-beam sputtering); ion-assisted deposition; chemical vapor deposition CVD; sol-gel coatings; or atomic layer deposition ALD.

In addition, the source contact element 124 and the drain contact element 126 may establish electrical contact with channel 114. Similarly, the gate contact element 122 may establish electrical contact with the gate 116.

In some examples, a capping layer may be configured to be onto the channel 114 and/or the gate 116.

In some of these examples, the capping layer may be configured to be additionally onto the electrolyte structure 112, and/or the gate contact element 122; and/or the source contact element 124; and/or the drain contact element 126.

In these examples, the capping layer may be of a material suitable for insulating oxygen ions, e.g., alumina $Al_2O_3$ or magnesium oxide MgO. As a result, the capping layer may prevent leakage of oxygen ions from the electronic transistor 100 (e.g., from the channel 114, from the gate 116) to an external medium; and/or inclusion of oxygen from the external medium to the electronic transistor 100 (e.g., to the channel 114, to the gate 116).

In addition, the capping layer may include a thickness between 1 nm and 500 nm, specifically between 1 nm and 100 nm.

The capping layer may be deposited via conventional synthesis and deposition methods such as physical vapor deposition PVD (e.g. cathodic arc deposition, electron-beam physical vapor deposition, close-space sublimation, pulsed laser deposition); thermal evaporation; electron-beam evaporation; sputtering (e.g. diode sputtering, RF diode sputtering, triode sputtering, magnetron sputtering, reactive sputtering, or ion-beam sputtering); ion-assisted deposition; chemical vapor deposition CVD; sol-gel coatings; or atomic layer deposition ALD.

In some examples, the capping layer may be deposited via atomic layer deposition ALD including a deposition chamber. In these examples, an aluminum precursor (e.g., metal alkyl trimethylaluminium TMA) may be chosen for alumina $Al_2O_3$ deposition. Each ALD cycle may include:

a first step with a duration of 0.1 second including a pulse of TMA;

a second step with a duration of 6 seconds including a purge of the deposition chamber with nitrogen gas;

a third step with a duration of 0.1 second including a pulse of water on the electronic transistor 100; and a fourth step with a duration of 6 seconds including a purge of the deposition chamber with nitrogen gas.

ALD cycles may be repeated to obtain a capping layer thickness of between 1 nm and 500 nm, specifically between 1 nm and 100 nm; and more specifically 100 nm. During the ALD cycles, the deposition chamber may be kept at 300° C.

Figure 2:
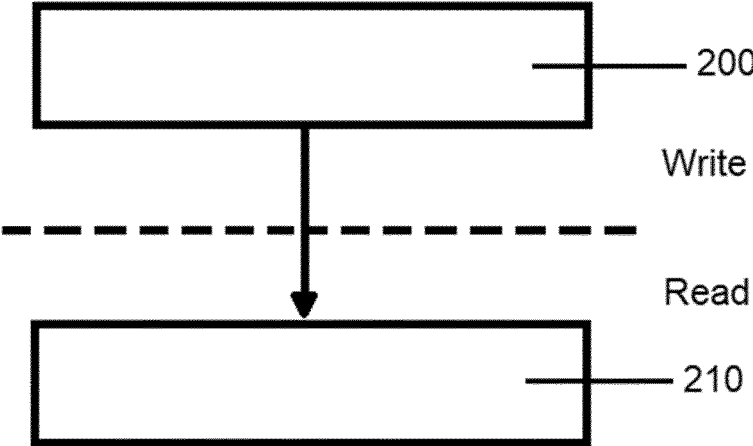
FIG. 2 (hereafter referred to as FIG. 2 in correlation to/with the drawings) illustrates a flow chart for operating switching operations of the electronic transistor according to an example of the present disclosure.

FIG. 2 illustrates a flow chart for operating switching operations of the electronic transistor. In FIG. 2, the operation of the electronic transistor 100 is described. In this example, switching operations may be performed between two different states that can be switched.

At block 200, a write voltage pulse may be applied at the gate contact element 122 through an external electrical circuit. As hereinbefore described in FIG. 1, the gate 116 may contact the electrolyte structure 112. Therefore, when a write voltage pulse is applied at the gate contact element 122, the electrolyte structure 112 contacting the gate 116 that is in electrical contact with the gate contact element 122, may transport and/or pump ions (e.g., $O^{2-}$) from an ion donor structure (i.e., a structure which may donate ions) to an ion receiver structure (i.e., a structure which may accept ions).

When a positive write voltage pulse is applied at the gate contact element 122, ions (e.g., $O^{2-}$) may be transported across the electrolyte structure 112 from the gate 116 (i.e., the ion donor structure) to the channel 114 (i.e., the ion receiver structure). By injecting ions (e.g., $O^{2-}$) to the channel 114, the oxygen content of the channel 114 may be varied (i.e., increased). It is noted that the oxygen content of the channel 114 may vary the conductance of the channel 114 due to the ion gating effect. Consequently, the electrical conductivity of the channel may be inherently varied because of the variation of the conductance of the channel.

Thereby, the electrical conductivity of the channel may be changed such as the channel 114 may be switched from an insulator state to a conductor state.

A negative write voltage pulse may serve to return the channel to its as-fabricated, insulator state, thereby permitting writing and re-writing operations to be performed. When a negative write voltage pulse is applied at the gate contact element 122, ions (e.g., $O^{2-}$) may be transported across the electrolyte structure 112 from the channel 114 (i.e., the donor ion structure) to the gate 116 (i.e., the receiver ion structure). Therefore, ions (e.g., $O^{2-}$) may be extracted from the channel 114 to the gate 116. Consequently, the oxygen content of the channel 114 may be varied (i.e., decreased). Thereby, the electrical conductivity of the channel may be changed such as the channel 114 may be switched from a conductor state to an insulator state. Thus, applying a negative write voltage pulse may restore the conductance of the channel 114 to its original state (prior to application of the positive write voltage pulse).

Additionally, depending on the voltage applied at the gate (i.e. the write voltage pulse), a plurality of intermediate channel states may be obtained between a first channel state where the conductance of the channel may correspond to an insulator state and a second channel state where the conductance of the channel may correspond to a conductor state. The conductance of the channel of each channel state of the plurality of intermediate channel states may be disposed between the conductance of the channel of the first channel state and the conductance of the channel of the second channel state. Therefore, a multilevel switching may be obtained between e.g. the first channel state and each channel state of the plurality of intermediate channel states; and/or between each channel state of the plurality of intermediate channel states and the second channel state. Consequently, the electronic transistor 100 may include a plurality of states (e.g. corresponding to the first channel state, the plurality of intermediate channel states, and/or the second channel state). Hence, the electronic transistor 100 may correspond to a plurality of CMOS transistors that may have only one state.

Consequently, an electronic transistor 100 configured to perform reversible and non-volatile write operations may be operated by applying a write voltage pulse (e.g. positive or negative) at the gate contact element 122.

At block 210, a read operation may be performed by the electronic transistor 100. The conductance of the channel may be read between the source contact element 124 and the drain contact element 126. Conductance switching may occur as ions (e.g., $O^{2-}$) are reversibly injected or extracted in and out of the channel 114 when a write voltage pulse is applied at the gate contact element 122.

Figure 3:
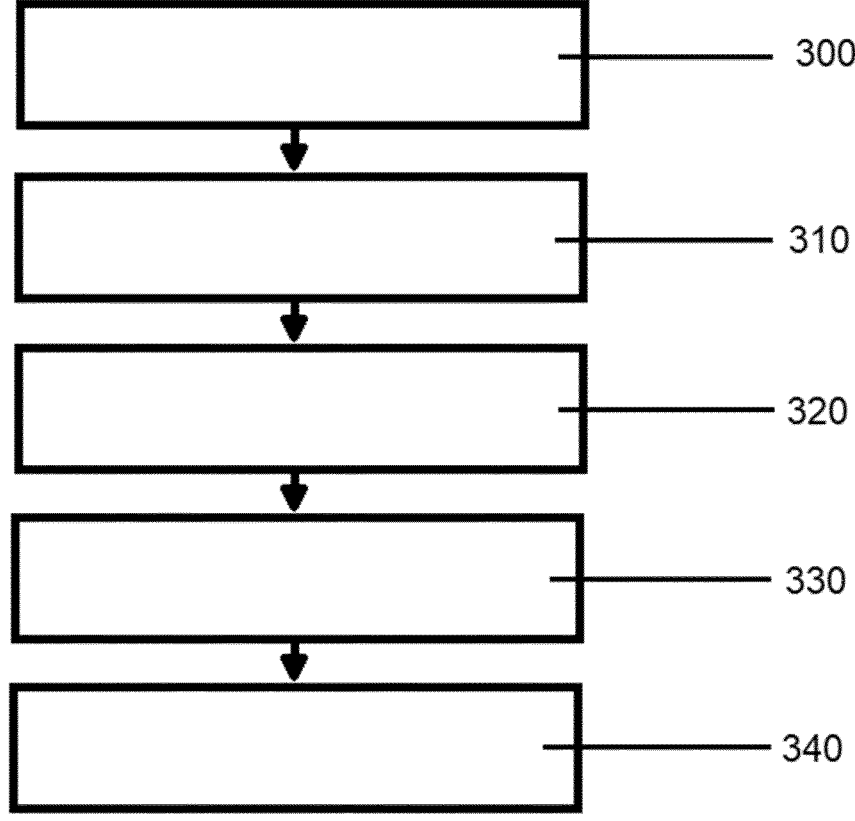
FIG. 3 (hereafter referred to as FIG. 3 in correlation to/with the drawings) illustrates a flow chart of a method for forming an electronic transistor according to an example of the present disclosure.

FIG. 3 illustrates a flow chart of a method for forming an electronic transistor 100.

At block 300, a channel may be deposited via conventional synthesis and deposition methods.

At block 310, a first contact element (i.e., source contact element) and a second contact element (i.e., drain contact element) may be deposited on the opposite ends of the channel via conventional synthesis and deposition methods.

At block 320, an electrolyte structure may be deposited on the side of the channel that is opposed to the side of the channel in which the first contact element and the second contact element are formed (e.g., the electrolyte structure may be on the bottom side of the channel whereas the first contact element and the second contact element may be on the top side of the channel) via conventional synthesis and deposition methods.

At block 330, a gate may be deposited on the electrolyte structure via conventional synthesis and deposition methods.

In some examples, the gate may be deposited on the side of the electrolyte structure that is opposed to the side of the electrolyte structure on which the channel is deposited (e.g., the gate may be on the bottom side of the electrolyte structure whereas the channel may be on the top side of the electrolyte structure).

Alternatively, the gate may be deposited on the side of the electrolyte structure on which the channel is deposited (e.g., the gate may be on the top side of the electrolyte structure and the channel may be on the top side of the electrolyte structure; or the gate may be on the bottom side of the electrolyte structure and the channel may be on the bottom side of the electrolyte structure).

At block 340, a third contact element (i.e., gate contact element) may be deposited on the gate via conventional synthesis and deposition methods.

In some examples, the method of forming an electronic transistor may further include depositing a seed on the channel before forming the first contact element and/or the second contact element, the seed being between the channel and the first contact element and/or the channel and the second contact element. The seed may be deposited via conventional synthesis and deposition methods.

In some examples, the method of forming an electronic transistor may further include depositing a capping layer arranged on the electronic transistor. Specifically, the capping layer may be configured to be onto the channel and/or the gate.

In some of these examples, the capping layer may be configured to be additionally onto the electrolyte, and/or the gate contact element; and/or the source contact element; and/or the drain contact element.

It is noted that conventional synthesis and deposition methods may include physical vapor deposition (PVD), for example, cathodic arc deposition, electron-beam physical vapor deposition, close-space sublimation, pulsed laser deposition; thermal evaporation; electron-beam evaporation; sputtering e.g. diode sputtering, RF diode sputtering, triode sputtering, magnetron sputtering, reactive sputtering, or ion-beam sputtering; ion-assisted deposition; chemical vapor deposition (CVD); sol-gel coatings; or atomic layer deposition (ALD).

Consequently, an electronic transistor 100, which may be compatible with CMOS fabrication processes, may be formed.

For reasons of completeness, various aspects of the present disclosure are set out in the following numbered clauses:

Clause 1. An electronic transistor comprising:
a body comprising at least:
an electrolyte structure;
a channel provided in contact with the electrolyte structure;
a gate provided in contact with the electrolyte structure;
at least three contact elements configured to be connected to an external circuit, at least one of the contact elements, referenced as Gate contact element, being separated from the electrolyte structure by the gate, and the other contact elements, referenced as Source contact element and Drain contact element, being interconnected and being separated from the electrolyte structure by the channel;
characterized in that the electrolyte structure comprises an oxygen ion conducting electrolyte structure, wherein the oxygen ion conducting electrolyte structure comprises a BiMEVOX structure, where Bi is Bismuth, ME is a Metal, V is Vanadium and OX is an OXide.

Clause 2. The transistor according to clause 1, wherein the BiMEVOX structure is configured to work in a temperature between 0° C. and 200° C.

Clause 3. The transistor according to clause 2, wherein the BiMEVOX structure is configured to work at room temperature.

Clause 4. The transistor according to any of clauses 1 to 3, wherein the metal ME is selected from at least one of the following:
Copper (BiCuVOX);
Cobalt (BiCoVOX);
Nickel (BiNiVOX);
Magnesium (BiMgVOX).

Clause 5. The transistor according to any of clauses 1 or 4, wherein the stoichiometry of the BiMEVOX structure is $Bi_4V_{2-x}ME_xO_{11-\delta}$, where $0<x<1$ and $0<\delta<1$.

Clause 6. The transistor according to clause 5, wherein the stoichiometry of the BiMEVOX structure is $Bi_4V_{1.8}Cu_{0.2}O_{10.7}$.

Clause 7. The transistor according to any of clauses 1 to 6, wherein the thickness of the BiMEVOX structure is between 1 nm and 1 mm.

Clause 8. The transistor according to any of clauses 1 to 7, wherein the channel comprises a Mixed Ionic and Electronic Conductor (MIEC) oxide configured to vary its oxygen content, which supposes a consequent variation in its electronic conductivity.

Clause 9. The transistor according to any of clauses 1 to 7, wherein the gate comprises a Mixed Ionic and Electronic Conductor (MIEC) oxide configured to vary its oxygen content, which supposes a consequent variation in its electronic conductivity.

Clause 10. The transistor according to any of clauses 8 or 9, wherein the Mixed Ionic and Electronic Conductor (MIEC) oxide is selected from at least one of the following:
a fluorite oxide;
a Perovskites oxide;
a Perovskite-derived structure.

Clause 11. The transistor according to clause 10, wherein the fluorite oxide comprises Rare earth (Re) doped Ceria such as $Ce_{1-x}Re_xO_{2-\delta}$, Re being selected from at least one of the following: Sm, Gd, Y, Pr, La.

Clause 12. The transistor according to any of clauses 10 or 11, wherein the Perovskites oxide comprises $La_{1-x}Sr_{1-x}TmO_{3-\delta}$, the Transition metal (Tm) being selected from at least one of the following: Ti, V, Cr, Mn, Fe, Co, Cu, Ni, and $0<x<1$.

Clause 13. The transistor according to clause 12, wherein the Perovskites oxide comprises a MIEC $La_{0.5}Sr_{0.5}FeO_{3-\delta}$ (LSF), where $0<\delta<0.5$.

Clause 14. The transistor according to any of clauses 10 to 13, wherein the Perovskite-derived structure comprises a Ruddlesden-Popper phase $La_{1-x}Sr_xTmO_{4+\delta}$, Tm being a Transition metal selected from at least one of the following: Mn, Cu, Ni, and $0<x<1$.

Clause 15. The transistor according to any of clauses 1 to 14, wherein the thickness of the channel is between 1 nm and 1 mm.

Clause 16. The transistor according to any of clauses 1 to 15, wherein the thickness of the gate is between 1 nm and 1 mm.

Clause 17. The transistor according to any of clauses 1 to 16, wherein the material of each of the at least three contact elements is selected from at least one of the following:

a metal material;
an electrically conductive polymer material;
an electrically conductive ceramic material.

Clause 18. The transistor according to clause 17, wherein the metal material is selected from at least one of the following:
Gold (Au);
Nickel (Ni);
Copper (Cu);
Platinum (Pt);
Palladium (Pd);
Any combination thereof.

Clause 19. The transistor according to any of clauses 1 to 18, wherein the thickness of any of the at least three contact elements is between 1 nm and 1 mm.

Clause 20. The transistor according to any of clauses 1 to 19, further comprising a seed between the Gate contact element and the gate and/or between at least one of the Source and the Drain contact elements, and the channel.

Clause 21. A method of forming an electronic transistor, the method comprising:
depositing a channel;
forming a first contact element, referenced as Source contact element, and a second contact element, referenced as Drain contact element, onto the channel;
depositing an electrolyte structure, wherein the electrolyte structure comprises a BiMEVOX structure, where Bi is Bismuth, ME is a Metal, V is Vanadium and OX is an OXide;
depositing a gate onto the electrolyte structure;
forming at least a third contact element, referenced as Gate contact element, onto the gate.

Clause 22. The method according to clause 21, wherein depositing the channel and depositing the gate comprise:
depositing the channel and the gate onto the same side of the deposited electrolyte structure, the channel and the gate being in contact with the electrolyte structure.

Clause 23. The method according to clause 21, wherein depositing the electrolyte structure comprises:
depositing the electrolyte structure onto the side of the deposited channel that is opposed to the side of the deposited channel on which the first contact element and the second contact element are formed, the channel being in contact with the electrolyte structure;
wherein depositing the gate onto the electrolyte structure comprises:
depositing the gate onto the side of the electrolyte structure that is opposed to the side on which the electrolyte structure is in contact with the channel, the gate being in contact with the electrolyte structure.

Clause 24. The method according to any of clauses 21 to 23, further comprising:
depositing a seed onto the channel before forming the first contact element and/or the second contact element, the seed being between the channel and the first contact element and/or the channel and the second contact element.

Clause 25. The method according to any of clauses 21 to 24, further comprising:
depositing a seed onto the gate before forming the third contact element, the seed being between the gate and the third contact element.

Clause 26. A method of forming an electronic transistor, the method comprising:
depositing an electrolyte structure, wherein the electrolyte structure comprises a BiMEVOX structure, where Bi is Bismuth, ME is a Metal, V is Vanadium and OX is an OXide;

depositing a channel onto the deposited electrolyte structure;

depositing a gate onto the electrolyte structure on the same side of the electrolyte structure on which the channel is deposited;

forming a first contact element, referenced as Source contact element, and a second contact element, referenced as Drain contact element, onto the channel;

forming at least a third contact element, referenced as Gate contact element, onto the gate.

Clause 27. A method of forming an electronic transistor, the method comprising:

depositing a channel;

forming a first contact element, referenced as Source contact element, and a second contact element, referenced as Drain contact element, onto the channel;

depositing an electrolyte structure on top of the channel, wherein the electrolyte structure comprises a BiMEVOX structure, where Bi is Bismuth, ME is a Metal, V is Vanadium and OX is an OXide;

depositing a gate on top of the electrolyte structure;

forming at least a third contact element, referenced as Gate contact element, onto the gate.

Although only a number of examples have been disclosed herein, other alternatives, modifications, uses and/or equivalents thereof are possible. Furthermore, all possible combinations of the described examples are also covered. Thus, the scope of the present disclosure should not be limited by particular examples but should be determined only by a fair reading of the claims that follow. If reference signs related to drawings are placed in parentheses in a claim, they are solely for attempting to increase the intelligibility of the claim and shall not be construed as limiting the scope of the claim.

The invention claimed is:

1. An electronic transistor comprising:

a body comprising at least:

an electrolyte structure;

a channel provided in contact with the electrolyte structure;

a gate provided in contact with the electrolyte structure;

at least three contact elements configured to be connected to an external circuit, at least one of the contact elements, referenced as a Gate contact element, being separated from the electrolyte structure by the gate, and the other contact elements, referenced as a Source contact element and a Drain contact element, being interconnected and being separated from the electrolyte structure by the channel;

the electrolyte structure comprising an oxygen ion conducting electrolyte structure, the oxygen ion conducting electrolyte structure comprising a BiMEVOX structure, Bi being Bismuth, ME being a Metal, V being Vanadium and OX being an Oxide; the stoichiometry of the BiMEVOX structure being $Bi_4V_{2-x}ME_xO_{11-\delta}$, $0<x<1$ and $0<\delta<1$.

2. The transistor according to claim 1, the metal ME of the BiMEVOX structure is being selected from at least one of the following:

Copper (BiCuVOX);

Cobalt (BiCoVOX);

Nickel (BiNiVOX);

Magnesium (BiMgVOX).

3. The transistor according to claim 1, the BiMEVOX structure being configured to work in a temperature between 0° C. and 200° C.

4. The transistor according to claim 1, the channel comprising a Mixed Ionic and Electronic Conductor (MIEC) oxide configured to vary its oxygen content, including a consequent variation in its electronic conductivity.

5. The transistor according to claim 1, the gate comprising a Mixed Ionic and Electronic Conductor (MIEC) oxide configured to vary its oxygen content, including a consequent variation in its electronic conductivity.

6. The transistor according to claim 1, the Mixed Ionic and Electronic Conductor (MIEC) oxide being selected from at least one of the following:

a fluorite oxide;

a Perovskites oxide;

a Perovskite-derived structure.

7. The transistor according to claim 6, the fluorite oxide comprising Rare earth (Re) doped Ceria such as $Ce_{1-x}Re_xO_{2-\delta}$, Re being selected from at least one of the following: Sm, Gd, Y, Pr, La.

8. The transistor according to claim 6, the Perovskites oxide comprising $La_{1-x}Sr_{1-x}TmO_{3-\delta}$, the Transition metal (Tm) being selected from at least one of the following: Ti, V, Cr, Mn, Fe, Co, Cu, Ni, and $0<x<1$, such as a MIEC $La_{0.5}Sr_{0.5}FeO_{3-\delta}$ (LSF), where and $0<\delta<0.5$.

9. The transistor according to claim 6, the Perovskite-derived structure comprising a Ruddlesden-Popper phase $La_{1-x}Sr_xTmO_{4+\delta}$, Tm being a Transition metal selected from at least one of the following: Mn, Cu, Ni, and $0<x<1$.

10. The transistor according to claim 1, the material of each of the at least three contact elements being selected from at least one of the following:

a metal material;

an electrically conductive polymer material;

an electrically conductive ceramic material.

11. An electronic transistor comprising:

a body comprising at least:

an electrolyte structure;

a channel provided in contact with the electrolyte structure;

a gate provided in contact with the electrolyte structure;

at least three contact elements configured to be connected to an external circuit, at least one of the contact elements, referenced as a Gate contact element, being separated from the electrolyte structure by the gate, and the other contact elements, referenced as a Source contact element and a Drain contact element, being interconnected and being separated from the electrolyte structure by the channel;

the electrolyte structure comprising an oxygen ion conducting electrolyte structure, the oxygen ion conducting electrolyte structure comprising a BiMEVOX structure, Bi being Bismuth, ME being a Metal, V being Vanadium and OX being an OXide, the stoichiometry of the BiMEVOX structure being $Bi_4V_{2-x}ME_xO_{11-\delta}$, $0<x<1$ and $0<\delta<1$.

12. The transistor according to claim 11, the BiMEVOX structure being configured to work at room temperature.

13. The transistor according to claim 11, the oxide being selected from at least one of the following:

a fluorite oxide;

a Perovskites oxide;

a Perovskite-derived structure.

14. The transistor according to claim 13, the Perovskites oxide comprising a MIEC $La_{0.5}Sr_{0.5}FeO_{3-\delta}$ (LSF), and $0<\delta<0.5$.

15. The transistor according to claim 11, further comprising a seed between the Gate contact element and the gate and/or between the channel and at least one of the Source and the Drain contact elements.

16. A method of forming an electronic transistor, the method comprising:

depositing a channel;

forming a first contact element, referenced as a Source contact element, and a second contact element, referenced as a Drain contact element, onto the channel;

depositing an electrolyte structure, the electrolyte structure comprising a BiMEVOX structure, where Bi is Bismuth, ME is a Metal, V is Vanadium and OX is an OXide; the stoichiometry of the BiMEVOX structure being $Bi_4V_{2-x}ME_xO_{11-\delta}$, $0<x<1$ and $0<\delta<1$;

depositing a gate onto the electrolyte structure;

forming at least a third contact element, referenced as a Gate contact element, onto the gate.

17. The method according to claim 16, the depositing the channel and depositing the gate comprising:

depositing the channel and the gate onto the same side of the deposited electrolyte structure, the channel and the gate being in contact with the electrolyte structure.

18. The method according to claim 16, the depositing the electrolyte structure comprising:

depositing the electrolyte structure onto the side of the deposited channel that is opposed to the side of the deposited channel in on which the first contact element and the second contact element are formed, the channel being in contact with the electrolyte structure;

the depositing the gate onto the electrolyte structure comprising:

depositing the gate onto the side of the electrolyte structure that is opposed to the side on which the electrolyte structure is in contact with the channel, the gate being in contact with the electrolyte structure.

19. The method according to claim 16, further comprising:

depositing a seed onto the channel before forming the first contact element and/or the second contact element, the seed being between the channel and the first contact element and/or the channel and the second contact element.

20. The method according to claim 19, further comprising:

depositing a seed onto the gate before forming the third contact element, the seed being between the gate and the third contact element.

* * * * *